United States Patent
Bai et al.

(10) Patent No.: US 11,903,273 B2
(45) Date of Patent: Feb. 13, 2024

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lu Bai, Beijing (CN); Xin Zhang, Beijing (CN); Pengfei Yu, Beijing (CN); Jie Dai, Beijing (CN); Sen Du, Beijing (CN); Li Song, Beijing (CN); Xiaofeng Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 476 days.

(21) Appl. No.: 17/293,667

(22) PCT Filed: Jul. 27, 2020

(86) PCT No.: PCT/CN2020/104858
§ 371 (c)(1),
(2) Date: May 13, 2021

(87) PCT Pub. No.: WO2022/020998
PCT Pub. Date: Feb. 3, 2022

(65) Prior Publication Data
US 2022/0310744 A1   Sep. 29, 2022

(51) Int. Cl.
H10K 59/131 (2023.01)
H10K 50/84 (2023.01)
H10K 59/121 (2023.01)

(52) U.S. Cl.
CPC .......... H10K 59/131 (2023.02); H10K 50/84 (2023.02); H10K 59/1213 (2023.02); H10K 59/1216 (2023.02)

(58) Field of Classification Search
CPC ............. H10K 59/131; H10K 59/1213; H10K 59/1216; H10K 50/84
See application file for complete search history.

(56) References Cited

U.S. PATENT DOCUMENTS 10,636,863 B2 * 4/2020 Kim ..................... H10K 59/124
10,868,102 B1 12/2020 Zhang et al.
(Continued)

FOREIGN PATENT DOCUMENTS

CN   207705199 U   8/2018
CN   208622727 U   3/2019
(Continued)

*Primary Examiner* — Stephen G Sherman
(74) *Attorney, Agent, or Firm* — DINSMORE & SHOHL LLP

(57) ABSTRACT

The present disclosure relates to a display substrate and a display device. The display substrate includes: a base substrate including a display area and a non-display area includes a fan-out area; a signal line layer including a plurality of signal lines located in the fan-out area; a first metal layer including a first power line located in the non-display area; a first electrode layer including a first electrode portion; and an organic insulating layer having a groove located in the non-display area. On the base substrate, an orthographic projection of the first electrode portion at least partially overlaps with that of the first power line, an orthographic projection of the organic insulating layer at an edge of the groove at least partially overlaps with that of the fan-out area in a first overlapping area having at least part not overlapping with an orthographic projection of the first electrode portion.

19 Claims, 6 Drawing Sheets

(56) References Cited

U.S. PATENT DOCUMENTS

| | | | |
|---|---|---|---|
| 11,217,575 B2* | 1/2022 | Zhai | H01L 25/167 |
| 2019/0235682 A1* | 8/2019 | Choi | G06F 3/0412 |
| 2020/0106045 A1 | 4/2020 | Han et al. | |
| 2020/0258958 A1* | 8/2020 | Gai | H10K 59/38 |
| 2020/0321421 A1* | 10/2020 | Jeon | H10K 59/123 |
| 2021/0074788 A1 | 3/2021 | Cheng et al. | |

FOREIGN PATENT DOCUMENTS

| | | | | |
|---|---|---|---|---|
| CN | 109713017 A | 5/2019 | | |
| CN | 110416435 A | 11/2019 | | |
| EP | 3637470 A1 | 4/2020 | | |
| WO | WO-2019033811 A1 * | 2/2019 | | H01L 27/32 |

* cited by examiner

DISPLAY SUBSTRATE AND DISPLAY DEVICE

CROSS-REFERENCE TO RELATED APPLICATIONS

The present application is a U.S. National Stage Application under 35 U.S.C. § 371 of International Patent Application No. PCT/CN2020/104858, filed on Jul. 27, 2020, the disclosure of which is incorporated by reference herein in its entirety.

TECHNICAL FIELD

The present disclosure relates to the field of display technology, and in particular to a display substrate and a display device.

BACKGROUND

The flexible display panel that uses an organic light-emitting diode (referred to as OLED for short) as a light-emitting device and a thin film transistor (referred to as TFT for short) to perform signal control has become a dominant trend in the current OLED industry. After a circuit and a light-emitting device are formed on a substrate, encapsulation is performed using a chemical vapor deposition (referred to as CVD for short) process to protect the light-emitting device and ensure that the light-emitting device and other structures inside the panel are protected from oxidation reaction with an external environment.

SUMMARY

According to one aspect of the present disclosure, a display substrate is provided. The display substrate includes: a base substrate including a display area and a non-display area located at a periphery of the display area, wherein the non-display area includes a fan-out area; a signal line layer arranged on the base substrate and including a plurality of signal lines located in the fan-out area; a first metal layer arranged on one side of the signal line layer away from the base substrate and including a first power line located in the non-display area; a first electrode layer located on one side of the first metal layer away from the base substrate and including a first electrode portion, wherein an orthographic projection of the first electrode portion on the base substrate at least partially overlaps with an orthographic projection of the first power line on the base substrate, and the first electrode portion is electrically connected to the first power line; and an organic insulating layer located between the first metal layer and the first electrode layer and having a groove located in the non-display area, wherein an orthographic projection of the organic insulating layer at an edge of the groove on the base substrate at least partially overlaps, in a first overlapping area, with an orthographic projection of the fan-out area on the base substrate, and at least part of the first overlapping area does not overlap with an orthographic projection of the first electrode portion on the base substrate.

In some embodiments, the organic insulating layer is in direct contact with the first electrode layer.

In some embodiments, the display substrate further includes: a second metal layer located on one side of the first metal layer away from the base substrate, wherein the organic insulating layer includes: a first organic insulating layer located between the first metal layer and the second metal layer; and a second organic insulating layer located between the second metal layer and the first electrode layer, wherein the groove includes a second groove portion located within the second organic insulating layer.

In some embodiments, the display substrate further includes: a second metal layer located on one side of the first metal layer away from the base substrate, wherein the organic insulating layer includes: a first organic insulating layer located between the first metal layer and the second metal layer; and a second organic insulating layer located between the second metal layer and the first electrode layer, wherein the groove includes a first groove portion located within the first organic insulating layer and a second groove portion located within the second organic insulating layer.

In some embodiments, the display substrate further includes: a second metal layer located on one side of the first metal layer away from the base substrate, wherein the organic insulating layer includes: a first organic insulating layer located between the first metal layer and the second metal layer; and a second organic insulating layer located between the second metal layer and the first electrode layer, wherein the groove includes a first groove portion located within the first organic insulating layer, and the second organic insulating layer covers an upper side of the first groove portion.

In some embodiments, the groove is plural in number, the second metal layer includes a second metal portion electrically connected to the first power line and the first electrode portion through at least part of the grooves.

In some embodiments, the first electrode portion is located in the non-display area and at least partially surrounds the display area.

In some embodiments, the display area includes: a first boundary, a second boundary, a third boundary, and a fourth boundary, the first boundary and the third boundary are arranged opposite to each other, and the second boundary and the fourth boundary are arranged opposite to each other; and the non-display area includes a first peripheral area located outside the first boundary, a second peripheral area located outside the second boundary, a third peripheral area located outside the third boundary and a fourth peripheral area located outside the fourth boundary, the fan-out area is located within the fourth peripheral area, wherein the first electrode portion includes: a first portion continuously arranged in the first peripheral area, the second peripheral area, and the third peripheral area; two second portions located in the fourth peripheral area, respectively connected to the first portion located in the first peripheral area and the third peripheral area, and extending in a direction parallel to the fourth boundary; two third portions located in the fourth peripheral area, wherein orthographic projections of the two third portions on the base substrate overlap with the fan-out area; two fourth portions located in the fourth peripheral area, wherein both ends of each of the two fourth portions are respectively connected to one of the two third portions and one of the two second portions; and a fifth portion located in the fourth peripheral area, connected between the two third portions, and at least partially overlapping with the first power line.

In some embodiments, a width of each second portion in a direction perpendicular to the fourth boundary, a width of the fifth portion in a direction perpendicular to the fourth boundary, and a width of each fourth portion perpendicular to an extension direction of the fourth portion are all smaller than a width of each first portion perpendicular to an extension direction of the first portion, and are all larger than a width of each third portion in a direction perpendicular to the fourth boundary.

In some embodiments, an included angle between an extending direction of each fourth portion and the fourth boundary is 35 to 55 degrees.

In some embodiments, the fan-out area includes two fan-out sub-areas symmetrical to each other relative to a symmetry axis perpendicular to the fourth boundary, the first electrode portions are symmetrical to each other relative to the symmetry axis, and the fifth portion is located between the two fan-out sub-areas.

In some embodiments, the first power line includes: a sixth portion continuously arranged in the first peripheral area, the second peripheral area and the third peripheral area; two seventh portions located in the fourth peripheral area, respectively connected to the sixth portion located in the first peripheral area and the third peripheral area, and extending in a direction parallel to the fourth boundary; and an eighth portion located in the fourth peripheral area and between the two seventh portions, wherein an orthographic projection of the sixth portion on the base substrate partially overlaps with an orthographic projection of the first portion on the base substrate and is electrically connected to the first portion, orthographic projections of the two seventh portions on the base substrate partially overlap with orthographic projections of the two second portions on the base substrate and are electrically connected to the two second portions respectively, and an orthographic projection of the eighth portion on the base substrate partially overlaps with the fifth portion and the fan-out area and the eighth portion is electrically connected to the fifth portion.

In some embodiments, the sixth portion and the two seventh portions are both symmetrical to each other relative to a symmetry axis perpendicular to the fourth boundary, and the eighth portions are symmetrical to each other relative to the symmetry axis and are T-shaped.

In some embodiments, the first metal layer further includes a second power line located in the fourth peripheral area, and an orthographic projection of the second power line on the base substrate partially overlaps with the fan-out area and does not overlap with an orthographic projection of the first power line on the base substrate.

In some embodiments, the signal line layer includes: a first signal line layer arranged on the base substrate and including a plurality of first signal lines among the plurality of signal lines; and a second signal line layer arranged on one side of the first signal line layer away from the base substrate and including a plurality of second signal lines among the plurality of signal lines, wherein at least part of the plurality of second signal lines extend in parallel to and arranged alternately with at least part of the plurality of first signal lines, wherein in a direction parallel to the base substrate and perpendicular to an extending direction of the plurality of first signal lines or an extending direction of the plurality of second signal lines, an area between adjacent first signal line and second signal line among the plurality of first signal lines and the plurality of second signal lines is a spaced area, and an edge of an orthographic projection of the groove on the base substrate at least partially overlaps with an orthographic projection of the spaced area on the base substrate.

In some embodiments, the display substrate further includes: a display sub-pixel having a thin film transistor, a capacitor and an anode, wherein the thin film transistor includes a gate, a source and a drain, and the capacitor includes a first polar plate and a second polar plate, wherein the gate and the first polar plate are in the same layer and have the same material as the plurality of first signal lines, and the second polar plate is in the same layer and has the same material as the plurality of second signal lines, and/or the source and the drain are a part of the first metal layer, and/or the anode is a part of the first electrode layer.

In some embodiments, the display substrate further includes: a second metal layer located on one side of the first metal layer away from the base substrate; and a connection electrode located between the drain and the anode, and electrically connected to the drain and the anode respectively, wherein the connection electrode is a part of the second metal layer.

In some embodiments, the display substrate further includes: an encapsulation layer located on one side of the first electrode layer away from the base substrate, and covering the display area and part of the non-display area.

In another aspect of the present disclosure, a display device is provided. The display device includes: the display substrate as described previously.

BRIEF DESCRIPTION OF THE DRAWINGS

The accompanying drawings, which constitute part of this specification, illustrate exemplary embodiments of the present disclosure, and together with this specification, serve to explain the principles of the present disclosure.

The present disclosure may be more clearly understood from the following detailed description with reference to the accompanying drawings, in which.

Figure 1:
FIG. 1 is a schematic view of a hierarchical structure in an embodiment of the display substrate according to the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprising", "including" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

When the encapsulation fails (for example, the CVD structure is partially fractured with a crack), the crack of the organic layer or the inorganic layer will become a passage for water-vapor. Water-vapor enters into the panel along a breach or crack. When water-vapor invades into an organic material of the OLED, it will result in oxidation failure of the organic material and failure of emitting light. As water-vapor continues to invade along the crack, the failure area gradually grows, thereby causing an apparently defect in the display device, i.e. growing dark spot (GDS).

After research, it has been found that there are many signal lines leading out from the display area. In order to reduce the space occupied by the signal lines, the fan-out area at a periphery of the AA area is led out with signal lines located in different layers and with small intervals. Due to a film thickness tolerance between adjacent signal lines, when there is an overlapping area between an interval area of adjacent signal lines and a grooving edge of the organic layer for lapping joint of metals in different layers or blocking water-vapor, the metal layer formed on an upper side of adjacent signal lines are easily to be fractured due to a big film thickness tolerance, which results in that the encapsulation layer formed on the metal layer by a CVD process is peeled off or fractured, thereby increasing the risk that water-vapor invades into a circuit structure or a light-emitting material, and further affecting the display effect and service life of the display device.

In view of this, the embodiments of the present disclosure provide a display substrate and a display panel, which can improve the performance of the display device.

Figure 2A:
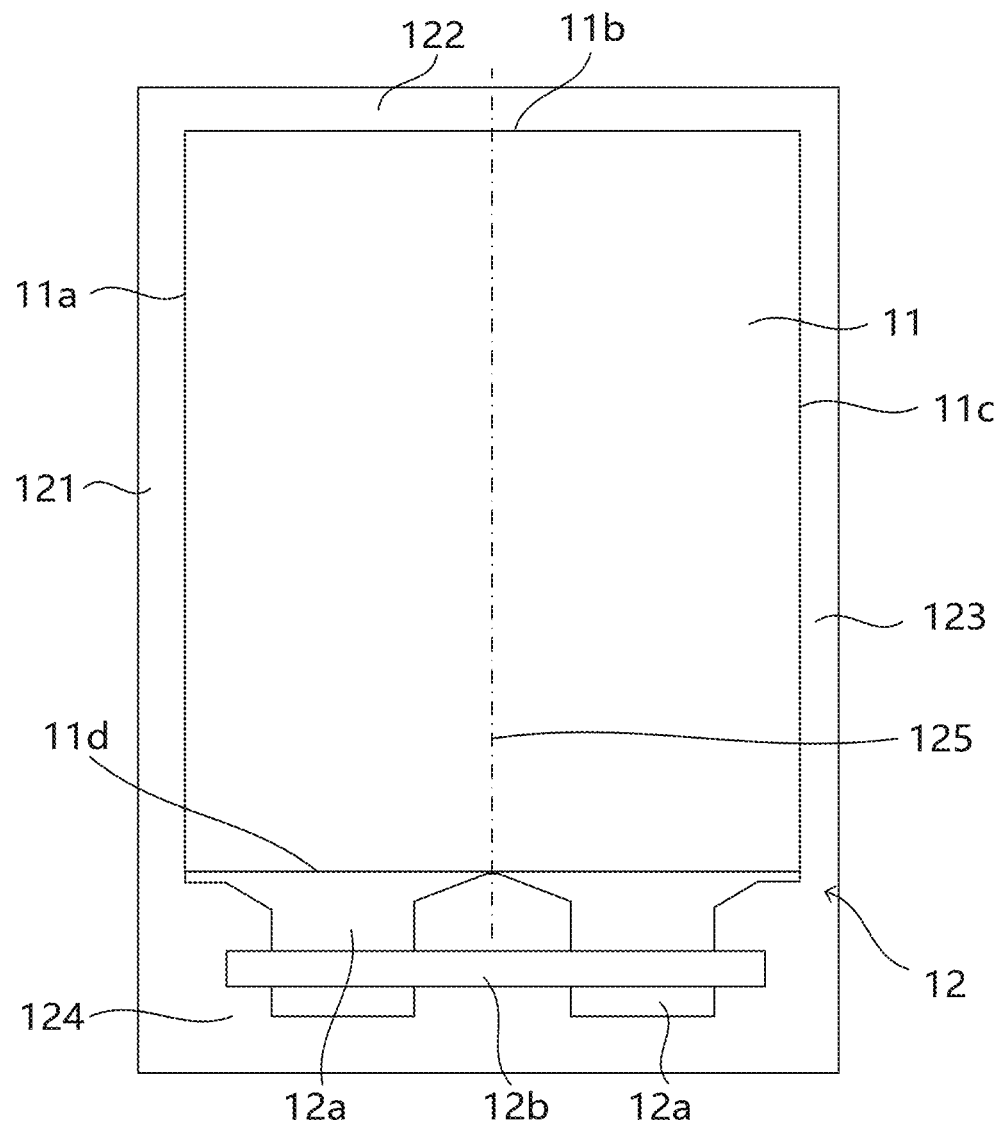
FIG. 2A is a schematic view of partitions of a base substrate in an embodiment of the display substrate according to the present disclosure.
Figure 2B:
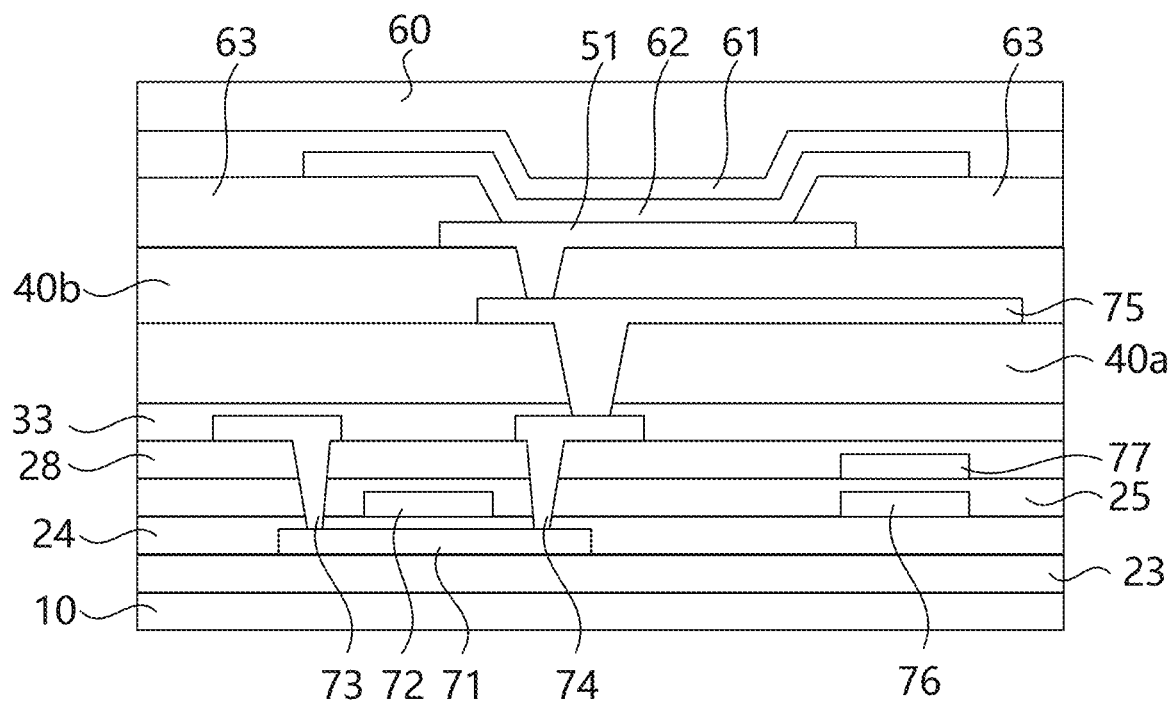
FIG. 2B is a schematic view of a hierarchical structure corresponding to display sub-pixels in an embodiment of the display substrate according to the present disclosure.

FIG. 1 is a schematic view of a hierarchical structure in an embodiment of the display substrate according to the present disclosure. FIG. 2A is a schematic view of partitions of a base substrate in an embodiment of the display substrate according to the present disclosure. FIG. 2B is a schematic view of a hierarchical structure corresponding to display sub-pixels in an embodiment of the display substrate according to the present disclosure.

Referring to FIGS. 1 and 2A, in some embodiments, the display substrate includes: a base substrate 10, a signal line layer 20, a first metal layer 30, an organic insulating layer 40, and a first electrode layer 50. Referring to FIG. 2A, in some embodiments, the base substrate 10 includes a display area 11 and a non-display area 12 located at a periphery of the display area 11.

The display substrate may further include a plurality of display sub-pixels located in the display area 11, wherein each display sub-pixel may display any color such as red, green, blue and white, so that the display substrate can present images.

In FIG. 2A, the non-display area 12 may include a fan-out area 12a. The signal line layer 20 may include a plurality of signal lines located in the fan-out area 12a. Referring to FIG. 2A, in some embodiments, the non-display area 12 may further include a bent area 12b. The display substrate may be bent in the bent area 12b. In some embodiments, the fan-out area 12a may pass through the bent area 12b and partially overlap with the bent area 12b.

Referring to FIG. 2A, in some embodiments, the display area 11 includes: a first boundary 11a, a second boundary 11b, a third boundary 11c, and a fourth boundary 11d. The first boundary 11a and the third boundary 11c are oppositely arranged, and the second boundary 11b and the fourth boundary 11d are oppositely arranged. In some embodiments, the first boundary 11a and the third boundary 11c are parallel to each other and perpendicular to the second boundary 11b and the fourth boundary 11d that are parallel to each other.

By way of the above-described boundaries, the non-display area 12 may further include a plurality of peripheral areas. In FIG. 2A, the non-display area 12 includes a first peripheral area 121 located outside the first boundary 11a, a second peripheral area 122 located outside the second boundary 11b, a third peripheral area 123 located outside the third boundary 11c and a fourth peripheral area 124 located outside the fourth boundary 11d. The fan-out area 12a is located within the fourth peripheral area 124. In some embodiments, the bent area 12b is also located within the fourth peripheral area 124.

In FIG. 1, the signal line layer 20 may include a first signal line layer 21 and a second signal line layer 22. The first signal line layer 21 is arranged on the base substrate 10, and the second signal line layer 22 is arranged on one side of the first signal line layer 21 away from the base substrate 10. One part of a plurality of signal lines included in the signal line layer 20 are located in the first signal line layer 21, and the other part of the plurality of signal lines are located in the second signal line layer 22. The signal lines in the first signal line layer 21 and the signal lines in the second signal line layer may be spaced apart by an insulating layer.

Referring to FIG. 2B, in some embodiments, the display sub-pixel has a thin film transistor, a capacitor, an anode 51, an organic light-emitting layer 62, and a cathode 61. The thin film transistor includes an active layer 71, a gate 72, a source 73, and a drain 74. The anode 51 is directly electrically connected to the drain 74 of the thin film transistor through a via hole, or electrically connected to the drain 74 through a connection electrode 75. The organic light-emitting layer 62 is located between the anode 51 and the cathode 61, and the cathode 61 is electrically connected to a common power line. The capacitor includes a first polar plate 76 and a second polar plate 77. In some embodiments, at least one of the plurality of signal lines in the signal line layer 20 may be in the same layer and have the same material as the gate 72 of the thin film transistor of the display sub-pixel, so that part of the signal lines and the gate may be formed by the same patterning process, thereby simplifying the machining process.

In FIG. 2B, the base substrate 10 is covered with a buffer layer 23, and the active layer 71 is formed on a surface of the buffer layer 23. The first insulating layer 24 is located on one side of the buffer layer 23 away from the base substrate 10, and covers the active layer 71. The gate 72 and the first polar plate 76 are formed on a surface of the first insulating layer 24. The second insulating layer 25 is located on one side of the first insulating layer 24 away from the base substrate 10, and covers the gate 72 and the first polar plate 76. The second polar plate 77 is formed on a surface of the second insulating layer 25, and the third insulating layer 28 is located on one side of the second insulating layer 25 away from the base substrate 10 and covers the second polar plate 77. The source 73 and the drain 74 are formed on a surface of the third insulating layer 28, and electrically connected to the active layer 71 through via holes respectively. The passivation layer 33 is located on one side of the third insulating layer 28 away from the base substrate 10, and covers the source 73 and the drain 74.

The first organic insulating layer 40a is located on one side of the passivation layer 33 away from the base substrate 10, and the connection electrode 75 is formed on a surface of the first organic insulating layer 40a and electrically connected to the drain 74 through a via hole. The second organic insulating layer 40b is located on one side of the first organic insulating layer 40a away from the base substrate 10, and the anode 51 is formed on a surface of the second organic insulating layer 40b and electrically connected to the connection electrode 75 through a via hole. The pixel defining layer 63 is formed on a surface of the second organic insulating layer 40b, and a part of the anode 51 is exposed. The organic light-emitting layer 62 is formed on the anode 51, and the cathode 61 is formed on the organic light-emitting layer 62. The encapsulation layer 60 encapsulates the display substrate on one side of the cathode 61 away from the base substrate 10.

In other embodiments, the plurality of first signal lines in the first signal line layer 21 may be in the same layer and have the same material as the gate 72 of the thin film transistor and the first polar plate 76 of the capacitor. The plurality of second signal lines in the second signal line layer 22 may be in the same layer and have the same material as the second polar plate 77 of the capacitor. This facilitates the less use of patterning processes and the simplification of the machining process.

In FIG. 1, the first metal layer 30 is arranged on one side of the signal line layer 20 away from the base substrate 10, and the first electrode layer 50 is located on one side of the first metal layer 30 away from the base substrate 10. The organic insulating layer 40 is located between the first metal layer 30 and the first electrode layer 50. In some embodiments, the organic insulating layer 40 is directly in contact with the first electrode layer 50.

In some embodiments, the source 73 and the drain 74 of the thin film transistor of the display sub-pixel are part of the first metal layer 30, which allows that a part of the first metal layer located in the non-display area and the source and drains located in the display area are formed by the same patterning process, thereby simplifying the machining process. In some embodiments, the anode 51 is a part of the first electrode layer 50, which allows that a part of the first electrode layer located in the non-display area and the anode located in the display area are formed by the same patterning process, thereby simplifying the machining process.

Referring to FIG. 1, in some embodiments, the display substrate further includes an encapsulation layer 60. The encapsulation layer 60 may include at least one of an organic encapsulation layer and an inorganic encapsulation layer. The encapsulation layer 60 is located on one side of the first electrode layer 50 away from the base substrate 10, and may cover the display area 11 and a part of the non-display area 12. For example, the encapsulation layer 60 covers the second electrode layer (for example, a cathode layer) of the display sub-pixels within the display area 11, and covers a part above the bent area 12b in the non-display area 12.

Figure 3A:
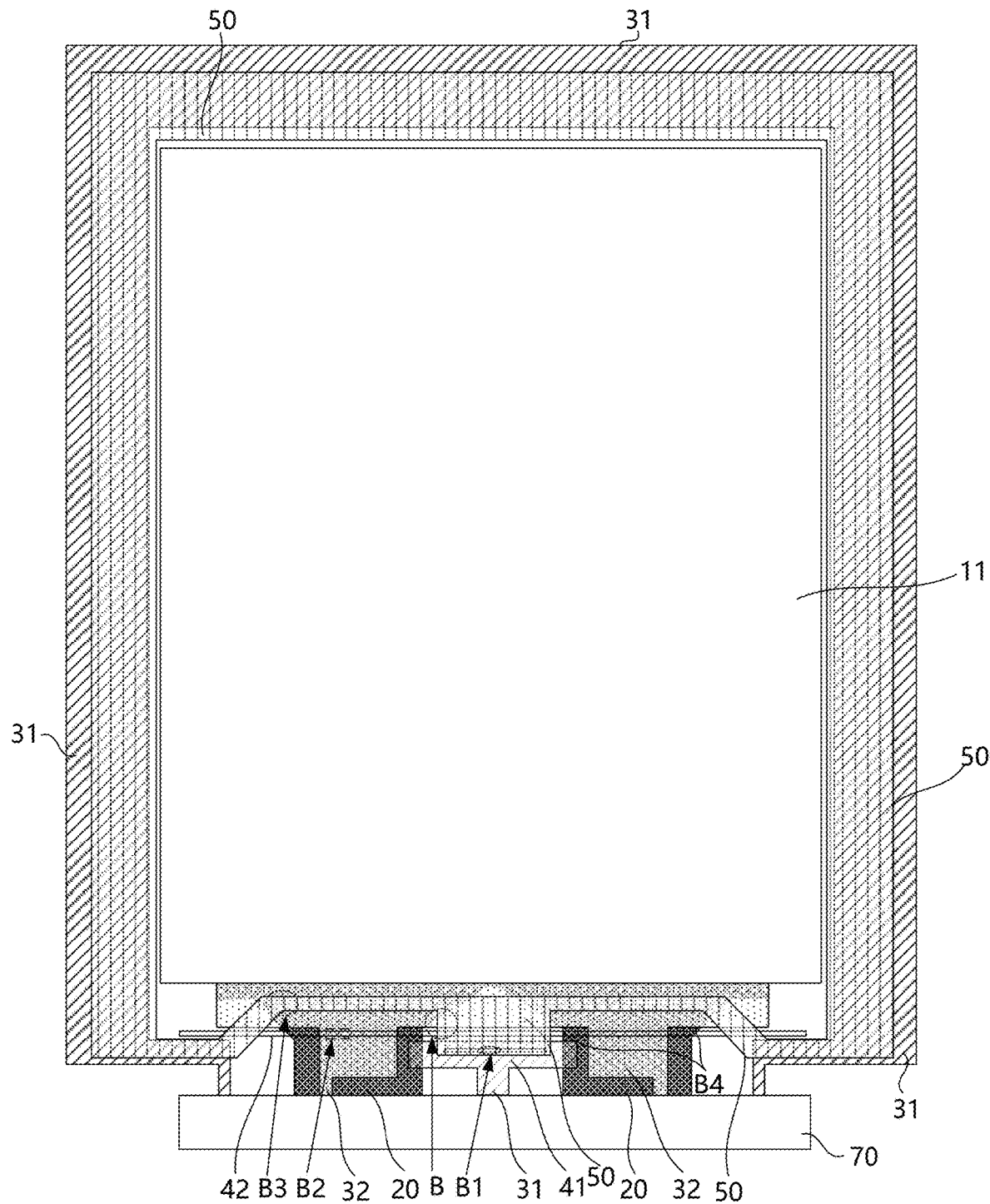
FIG. 3A is a schematic view of a layout in an embodiment of the display substrate according to the present disclosure.
Figure 3B:
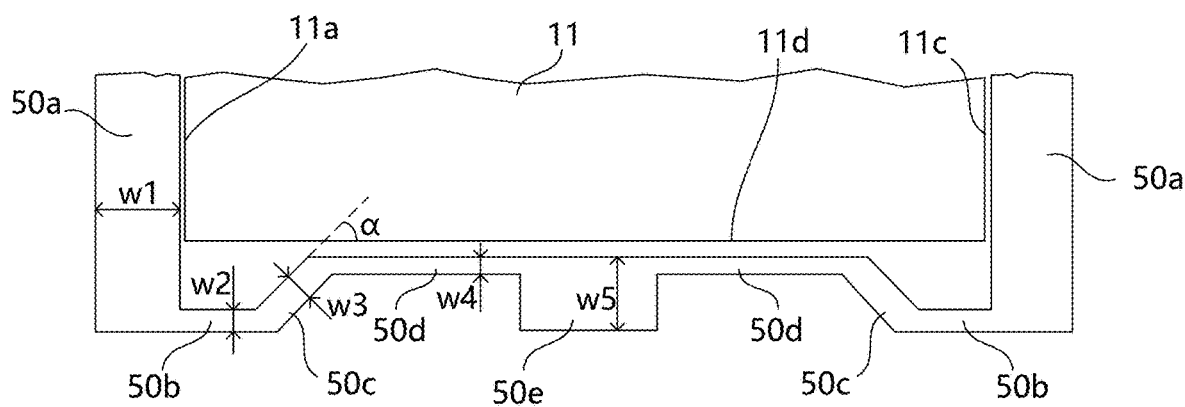
FIG. 3B is a partial schematic view of a first electrode layer relative to a display area in an embodiment of the display substrate according to the present disclosure.
Figure 3C:
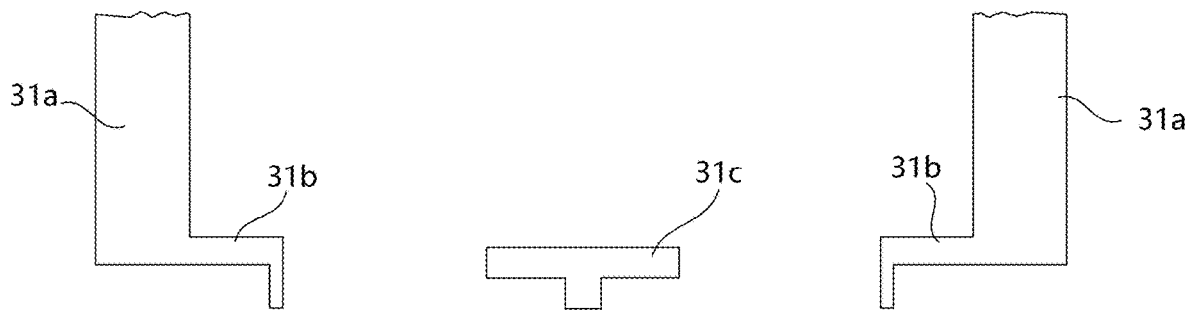
FIG. 3C is a partial schematic view of a first power line relative to a display area in an embodiment of the display substrate according to the present disclosure.

FIG. 3A is a schematic view of a layout in an embodiment of the display substrate according to the present disclosure. FIG. 3B is a partial schematic view of a first electrode layer relative to a display area in an embodiment of the display substrate according to the present disclosure. FIG. 3C is a partial schematic view of a first power line relative to a display area in an embodiment of the display substrate according to the present disclosure.

Referring to FIGS. 3A-3C, in some embodiments, the first metal layer 30 includes a first power line 31 and a second power line 32 located in the non-display area 12. During operation, the second power line 32 and the first power line 31 may be set to different voltages respectively. For example, the first power line 31 is set to a negative power supply voltage VSS, and the second power line 32 is set to a positive power supply voltage VDD.

Referring to FIGS. 3A and 3B, in some embodiments, the first electrode portion is located in the non-display area and at least partially surrounds the display area. In FIG. 3B, the first electrode portion includes: a first portion 50a, two second portions 50b, two third portions 50d, two fourth portions 50c, and a fifth portion 50e.

Referring to FIGS. 2A and 3A, in FIG. 3B, the first portion 50a is continuously arranged in the first peripheral area 121, the second peripheral area 122, and the third peripheral area 123. The two second portions 50b are located in the fourth peripheral area 124 and connected to the first portion 50a located in the first peripheral area 121 and the third peripheral area 123 respectively, and the two second portions 50b extend in a direction parallel to the fourth boundary 11d. The two third portions 50d are located in the fourth peripheral area 124, and the orthographic projection of the two third portions 50d on the base substrate 10 overlap with the fan-out area 12a. The two fourth portions 50c are located in the fourth peripheral area 124, and both ends of each of the two fourth portions 50c are respectively connected to one of the two third portions 30d and one of the two second portions 50b. The fifth portion 50e is located in the fourth peripheral area 124 and connected between the two third portions 50d, and at least partially overlaps with the first power line 31.

Referring to FIG. 3B, in some embodiments, the width w2 of each second portion 50b in a direction perpendicular to the fourth boundary 11d, the width w5 of the fifth portion 50e in a direction perpendicular to the fourth boundary 11d and the minimum width w3 of each fourth portion 50c are all smaller than the width w1 of each first portion 50a in a direction perpendicular to the first boundary 11a or the third boundary 11c, and are all larger than the width w4 of each third portion 50d in a direction perpendicular to the fourth boundary 11d. In some embodiments, the display panel further includes a pixel defining layer. Moreover, a smaller width w4 is set so as to enhance the water and oxygen protection in the fourth peripheral area since the pixel defining layer covers the first electrode portion located outside the display area.

In some embodiments, w1 is 1000-1100 μm, for example 1070 μm; w2 is 520-560 μm, for example 545 μm; w3 is 420-480 μm, for example 450 μm; w4 is 120-180 μm, for example 150 μm; and w5 is 550-600 μm, for example 570 μm.

In FIG. 3B, the included angle between a length direction of each fourth portion 50c and the fourth boundary 11d is 35 to 55 degrees, for example, 45 degrees. The fourth portion thus inclinedly arranged can increase the area of the first electrode portion and reduce the resistance.

Referring to FIGS. 3B and 3C, in some embodiments, the fan-out area 12a includes two fan-out sub-areas. The two fan-out sub-areas are symmetrical to each other relative to a symmetry axis perpendicular to the fourth boundary 11d (for example, a symmetry reference line 125 located in the center of the display area in FIG. 2A and perpendicular to the fourth boundary 11d). The first electrode portions may be symmetrical to each other relative to the symmetry axis. In FIG. 3B, the first portion 50a, the two second portions 50b, the two third portions 50d, and the two fourth portions 50c of the first electrode portion are all symmetrical to each other relative to the symmetry axis. In addition, the fifth portion 50e is located between the two fan-out sub-areas and symmetrical to each other relative to the symmetry axis.

Referring to FIGS. 3A and 3C, in some embodiments, the first power line includes: a sixth portion 31a, two seventh portions 31b, and an eighth portion 31c. The sixth portion 31a is continuously arranged in the first peripheral area 121, the second peripheral area 122 and the third peripheral area 123. The two seventh portions 31b are located in the fourth peripheral area 124 and respectively connected to the sixth portion 31a located in the first peripheral area 121 and the third peripheral area 123, and the two seventh portions 31b extend along a direction parallel to the fourth boundary 11d. The eighth portion 31c is located in the fourth peripheral area 124, and located between the two seventh portions 31b.

Referring to FIGS. 3A-3C, in some embodiments, the orthographic projection of the sixth portion 31a on the base substrate 10 partially overlaps with the orthographic projection of the first portion 50a on the base substrate 10 and is electrically connected to the first portion 50a. The orthographic projections of the two seventh portions 31b on the base substrate 10 partially overlap with the orthographic projections of the two second portions 50b on the base substrate 10 and are electrically connected to the two second portions 50b respectively. The orthographic projection of the eighth portion 31c on the base substrate 10 partially overlaps with the fifth portion 50e and the fan-out area 12a, and the eighth portion 31c is electrically connected to the fifth portion 50e.

In addition, referring to FIG. 3C, in some embodiments, the sixth portions 31a are symmetrical to each other relative to the symmetry axis perpendicular to the fourth boundary, the two seventh portions 31b are symmetrical to each other relative to the symmetry axis, and the eighth portions 31c are symmetrical to each other relative to the symmetry axis, and are T-shaped.

Referring to FIGS. 3A and 3C, the orthographic projection of the second power line 32 on the base substrate 10 partially overlaps with the fan-out area 12a, and does not overlap with the orthographic projection of the eighth portion 31c on the base substrate.

An organic insulating layer 40 is provided between the first metal layer 30 and the first electrode layer 50. A groove located in the non-display area 12 and penetrating through the organic insulating layer 40 in a direction perpendicular to the base substrate 10 may be provided in the organic insulating layer 40, so as to implement a lapping joint between the first power line 31 or the second power line 32 and the first electrode layer 50. In addition, grooves are provided in some positions so that it is possible to prevent water-vapor from entering the display area, thereby reducing the adverse effect of water-vapor on the display area.

In some embodiments, the groove in FIG. 3A includes a first groove 41 and a second groove 42. The orthographic projection of the first groove 41 on the base substrate is located within an area between adjacent fan-out sub-areas among at least two fan-out sub-areas included in the fan-out area 12a. The second groove 42 is transversely arranged between the display area 11 and the bent area 12b, and its orthographic projection on the base substrate may partially overlap with the fan-out area 12a, the first electrode layer 50 and the second power line 32 respectively. It should be noted that the groove is not limited to the position shown in FIG. 3A.

Referring to FIG. 3A, in some embodiments, the groove may be provided such that: the orthographic projection of the groove on the base substrate 10 at least partially overlaps, in the first overlapping area B4, with the orthographic projection of the fan-out area 12a on the base substrate 10. At least part of the first overlapping area B4 does not overlap with the orthographic projection of the first electrode layer 50 on the base substrate 10.

In FIG. 3A, the first overlapping area B4 where the orthographic projection of the groove overlaps with the fan-out area 12a includes an overlapping portion of the orthographic projection of the second groove 42 and the fan-out area 12a (for example, a range enclosed by a marked leading line corresponding to B4 in FIG. 3A). However, the orthographic projection of the first electrode layer 50 on the base substrate 10 does not include the first overlapping area B4. This avoids the problem when the signal line layer located in the fan-out area overlaps with an edge of the groove in a direction perpendicular to the base substrate.

Figure 4A:
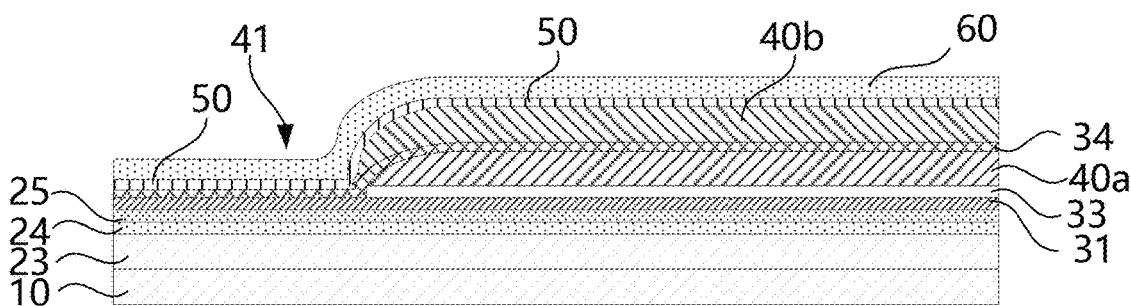
FIGS. 4A-4C are respectively schematic views of a hierarchical structure of positions B1, B2, and B3 in FIG. 3A from a perspective along an extending direction of a groove.
Figure 4B:
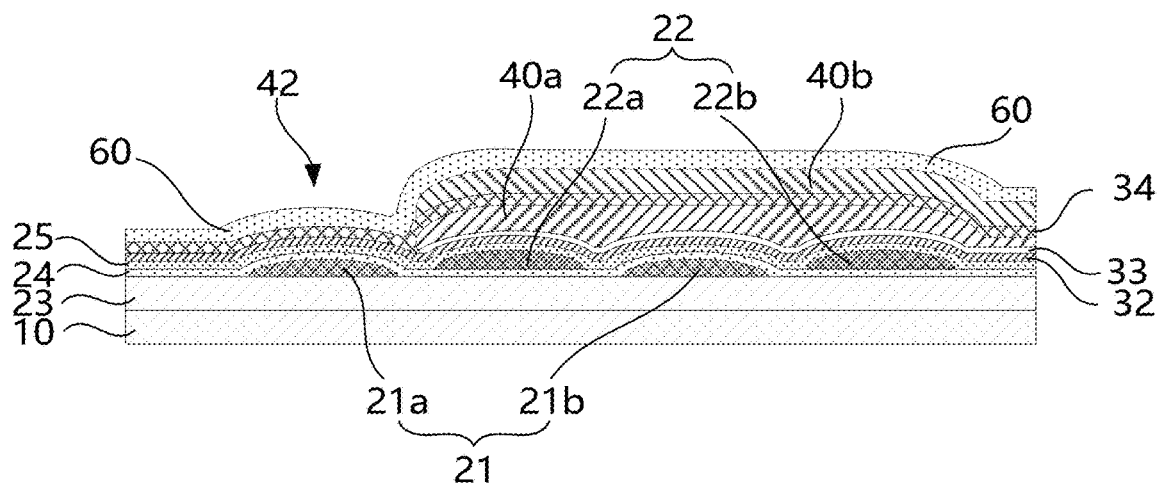
Figure 4C:
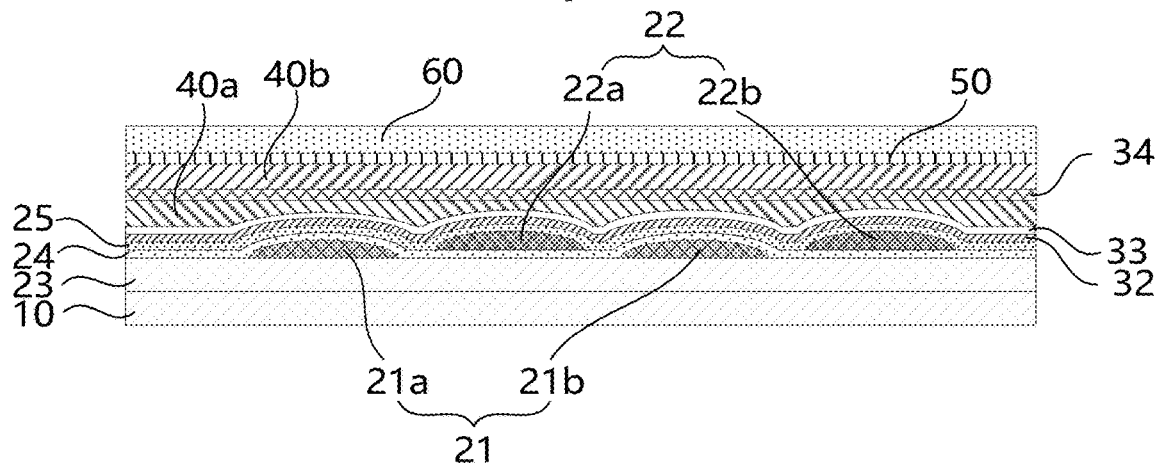
Figure 4D:
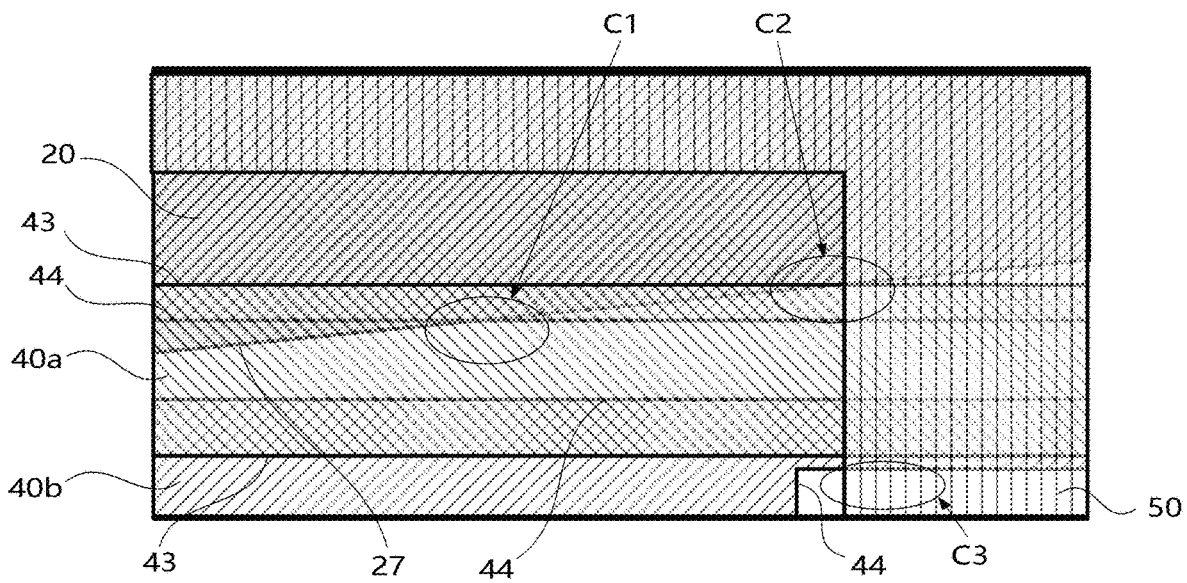
FIG. 4D is a schematic view of a layout of a first electrode layer, a second organic insulating layer, a first organic insulating layer, and a signal line layer at a position B in FIG. 3A.
Figure 5A:
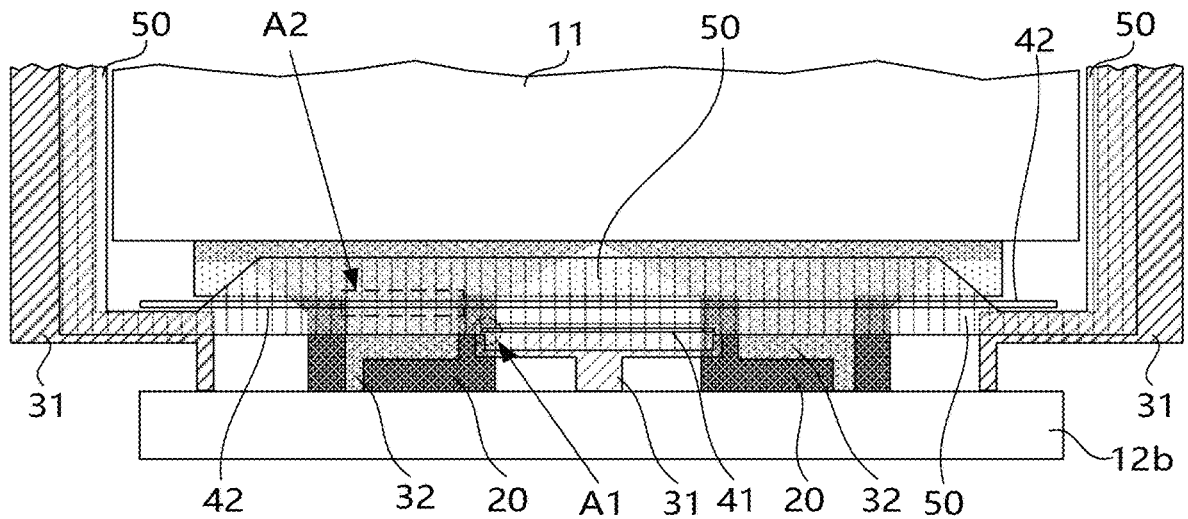
FIG. 5A is a schematic view of a layout that a first overlapping area of the display substrate overlaps with an orthographic projection of a second metal layer on the base substrate in a comparative solution.
Figure 5B:
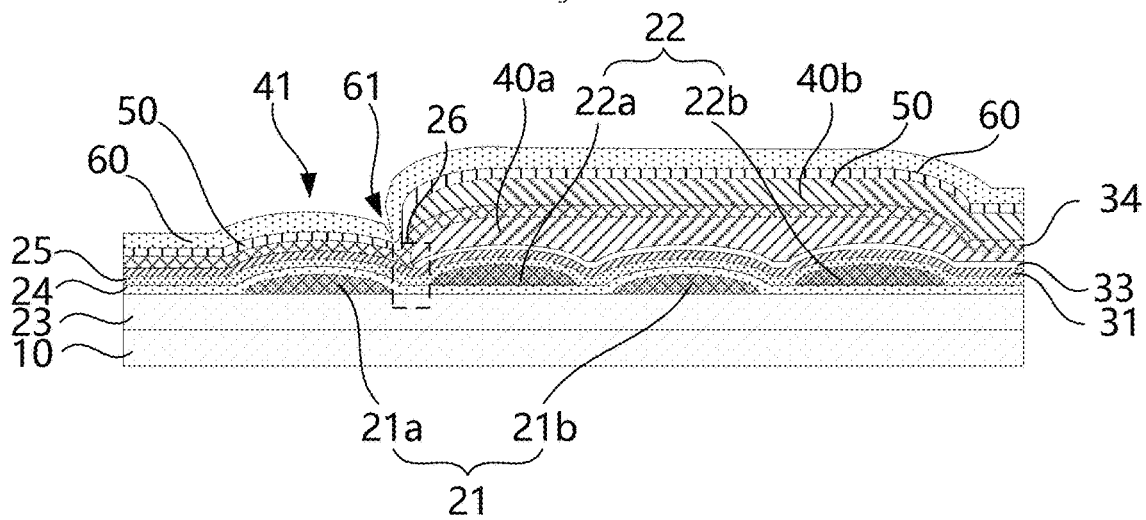
FIGS. 5B and 5C are respectively schematic views of a hierarchical structure of positions A1 and A2 in FIG. 5A from a perspective along an extending direction of a groove.
Figure 5C:
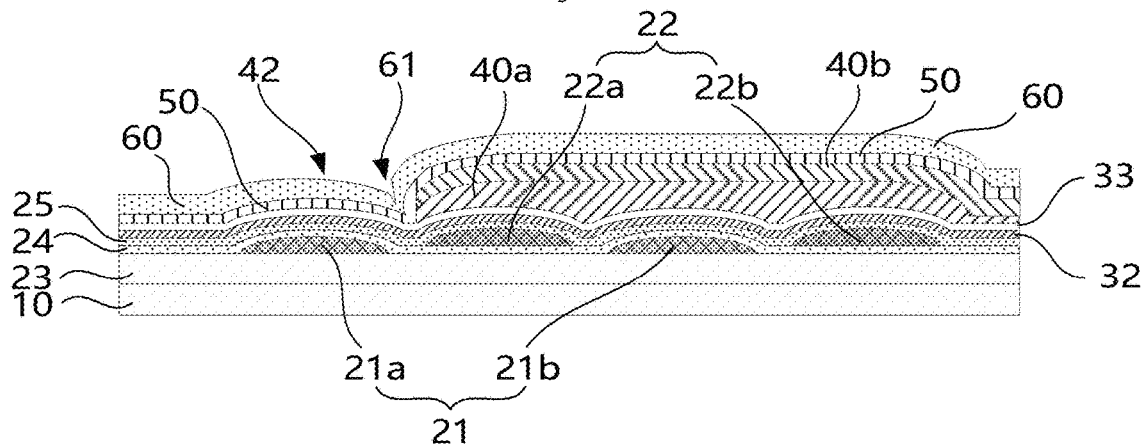

FIGS. 4A-4C are respectively schematic views of a hierarchical structure of positions B1, B2, and B3 in FIG. 3A from a perspective along an extending direction of a groove. FIG. 4D is a schematic view of a layout of a first electrode layer, a second organic insulating layer, a first organic insulating layer, and a signal line layer at a position B in FIG. 3A. FIG. 5A is a schematic view of a layout that a first overlapping area of the display substrate overlaps with an orthographic projection of a second metal layer on the base substrate in a comparative solution. FIGS. 5B and 5C are respectively schematic views of a hierarchical structure of positions A1 and A2 in FIG. 5A from a perspective along an extending direction of a groove.

In order to better understand this problem, referring to FIG. 5A, if the orthographic projection of the first electrode layer 50 on the base substrate overlaps with the first overlapping area, for example, the positions A1 and A2 circled by the dotted lines in FIG. 5A overlap, a plurality of signal lines densely distributed in the signal line layer of the fan-out area and located in different layers are likely to cause a significant film thickness tolerance of the organic insulating layer at an edge position of the groove. As a result, the surface of the first electrode layer covered inside and outside the groove is easily to be damaged or fractured, and the stress after its damage or fracture increases, and the adhesive force between the encapsulation layer formed by the CVD process and the first electrode layer is weakened, which results in a crack in the encapsulation layer or falling-off of the encapsulation layer. The crack formed in this way might become a passage for water-vapor to invade the circuit structure of the display substrate or the light-emitting material, thereby affecting the display effect and life of the display substrate.

Referring to FIGS. 5A and 5B, from the perspective of a top view of the display substrate, the first groove 41, the signal line layer 20, the first power line 31, and the first electrode layer 50 overlap at the position A1. Corresponding to a hierarchical structure at the position A1 in FIG. 5B, the signal line layer 20 includes a first signal line layer 21 and a second signal line layer 22. The first signal line layer 21 includes a plurality of first signal lines 21a, 21b among the plurality of signal lines, and the second signal line layer 22 includes a plurality of second signal lines 22a, 22b among the plurality of signal lines. At least part of the plurality of second signal lines 22a, 22b extend in parallel and are arranged alternately with at least part of the plurality of first signal lines 21a, 21b. For example, in FIG. 5B, the first signal line 21a, the second signal line 22a, the first signal line 21b, and the second signal line 22b are arranged in sequence from left to right along a horizontal direction.

The first signal line and the second signal line are respectively located in different signal line layers which may be spaced apart by an insulating layer. For example, in FIG. 5B, the base substrate 10 is covered with a buffer layer 23, and the first signal lines 21a and 21b are formed on a surface of the buffer layer 23. The signal line layer 20 also includes a first insulating layer 24 and a second insulating layer 25. The first insulating layer 24 covers the surfaces of the first signal lines 21a, 21b and the buffer layer 23, the second signal lines 22a and 22b are formed on a surface of the first insulating layer 24, and the second insulating layer 25 covers the surfaces of the second signal lines 22a, 22b and the first insulating layer 24.

Referring to FIGS. 5B and 5C, the display substrate further includes a second metal layer 34. The first metal layer 30 and the second metal layer 34 may be spaced apart by a passivation layer 33. In FIG. 5B, the passivation layer 33 is located between the first power line 31 and the second metal layer 34. The first power line 31 is formed on the second insulating layer 25. At a position corresponding to the first groove 41, the passivation layer 33 has a first via hole so that the second metal layer 34 is electrically connected to the first power line 31 through the first via hole.

In FIG. 5B, the first signal line 21a and the second signal line 22a adjacently located in the fan-out area are located in different layers with small intervals, there is a large film thickness difference, and there is a steep transition angle therebetween. As a result, a large gradient difference is produced in the non-planar layer material (for example, an inorganic layer or a metal layer) formed above both of them. It is defined here that, in a direction parallel to the base substrate and perpendicular to an extension direction of the plurality of first signal lines or perpendicular to an extension direction of the plurality of second signal lines, an area between adjacent first signal line and second signal line among the plurality of first signal lines and the plurality of second signal lines is a spaced area, for example, the spaced area 26 marked by a dashed frame in FIG. 5B.

Referring to 5B and 5C, in some embodiments, the organic insulating layer 40 may include a second organic insulating layer 40b located between the first electrode layer 50 and the second metal layer 34, and a second organic insulating layer 40b located between the passivation layer 33 and the second metal layer. The first groove 41 is formed within the first organic insulating layer 40a and the second organic insulating layer 40b.

When the edge of the orthographic projection of the first groove 41 on the base substrate 10 at least partially overlaps with the orthographic projection of the spaced area 26 on the base substrate 10, at least one section of the first signal line 21a corresponds to the inside of the first groove 41, and at least one section of the second signal line 22a corresponds to the outside of the first groove 41. In other words, the edge of the first groove 41 may intersect with the adjacent first signal line and second signal line, or be located between the first signal line and the second signal line and parallel to the first signal line or the second signal line.

A planarization layer material located between the first electrode layer 50 and the second metal layer 34 and between the second metal layer 34 and the passivation layer 33 is not provided at a position corresponding to a bottom of the first groove 41, and a planarization layer material between the first electrode layer 50 and the second metal layer 34 is provided at a position outside the first groove 41, which further increases a thickness difference of a film layer above the first signal line 21a and the second signal line 22a. As a result, due to a large thickness difference of a film layer and a steep gradient change, the first electrode layer 50 located above the first signal line 21a and the second signal line 22a becomes more easily to be damaged or fractured at a position corresponding to the spaced area 26. The damage or fracture of the first electrode layer 50 further weakens an adhesive force between the encapsulation layer 60 and the first electrode layer 50, thereby resulting in falling-off or fracture of the encapsulation layer 60 (for example, the breach 61 of the encapsulation layer 60 shown in FIG. 5B).

Referring to FIGS. 5A and 5C, a problem similar to the position A1 is also present in the position A2. From a top view of the display substrate, the second groove 42, the signal line layer 20, the second power line 32 and the first electrode layer 50 overlap at the position A2. Corresponding to a hierarchical structure at the position A2 in FIG. 5C, the second metal layer 34 is located between the passivation layer 33 and the signal line layer 20. The second power line 32 within the second groove 42 is insulated with the second metal layer 34 by the passivation layer 33. Since there is a large thickness difference of a film layer above the first signal line 21a and the second signal line 22a, due to a large thickness difference of a film layer and a steep gradient change, the first electrode layer 50 located above the first signal line 21a and the second signal line 22a becomes more easily to be damaged or fractured at a position corresponding to the spaced area 26. Moreover, the damage or fracture of the first electrode layer 50 in turn further weakens an adhesive force between the encapsulation layer 60 and the first electrode layer 50, thereby resulting in falling-off or fracture of the encapsulation layer 60 (for example, the breach 61 of the encapsulation layer 60 shown in FIG. 5B).

It may be understood from the above-described description that: when the spaced area of adjacent signal lines located in different layers within the signal line layer partially overlaps with an edge of the groove of the organic insulating layer, it is possible to form a large thickness difference of a film above the adjacent signal lines. Correspondingly, if the first electrode layer is covered inside and outside the groove, the thickness difference of a film is likely to cause damage or fracture of the first electrode layer. Therefore, in the embodiments of the present disclosure, when the first electrode layer is formed, the orthographic projections of the first electrode layer, the groove and the signal line layer on the base substrate do not overlap, thereby reducing or avoiding the risk of damage or fracture of the first electrode layer.

Referring to FIGS. 3A, 4A-4D, from the perspective of a top view of the display substrate, it may be seen that compared with the first electrode layer in FIG. 5A, the area covered by the first electrode layer 50 in FIG. 3A does not include an overlapping portion of the groove and the fan-out area. In other words, the first electrode layer 50 bypasses the overlapping portion of the groove and the fan-out area.

Referring to FIG. 3A, in some embodiments, the orthographic projection of the first power line 31 on the base substrate 10 at least partially overlaps with the orthographic projection of the first electrode layer 50 on the base substrate 10 in second overlapping area. The fan-out area 12a may include at least two fan-out sub-areas, and the second overlapping area may be located within an interval area of adjacent fan-out sub-areas in the at least two fan-out sub-areas.

For example, in FIG. 3A, the T-shaped eighth portion of the first power line 31 is located between the two fan-out sub-areas, and its orthographic projection slightly overlaps with the two fan-out sub-areas. The second overlapping area of the orthographic projection of the first electrode layer 50 on the base substrate 10 and the orthographic projection of the T-shaped eighth portion on the base substrate 10 is rectangular. The orthographic projection of the first groove 41 included in the groove on the base substrate 10 is located within the second overlapping area. The first electrode layer 50 may be in lapping joint with the first power line 31 within the first groove 41.

The position B1 marked by the dotted line in FIG. 3A does not correspond to the fan-out area, so that there is no signal line layer, and its hierarchical structure is shown in FIG. 4A. Referring to FIGS. 4A and 4B, in some embodiments, the display substrate further includes a second metal layer 34. The second metal layer 34 includes a second metal portion. The first metal layer 30 and the second metal layer 34 may be spaced apart by a passivation layer 33. In some embodiments, the number of the grooves is plural, for example the first groove 41 and the second groove 42. The second metal portion may be electrically connected to the first power line 31 and the first electrode portion through at least part of the grooves.

In FIG. 4A, the passivation layer 33 is located between the first power line 31 and the second metal layer 34. The first power line 31 is formed on the second insulating layer 25. The passivation layer 33 has a first via hole corresponding to the first groove 41, so that the first power line 31 and the second metal layer 34 are electrically connected through the first via hole. From top to bottom, an encapsulation layer 60, a first electrode layer 50, a second metal layer 34, a first power line 31, a second insulating layer 25, a first insulating layer 24, a buffer layer 23 and a base substrate 10 are arranged in sequence inside the first groove 41. From top to bottom, an encapsulation layer 60, a first electrode layer 50, a first organic insulating layer 40a, a second metal layer 34, a second organic insulating layer 40b, a passivation layer 33, a first power line 31, a second insulating layer 25, a first insulating layer 24, a buffer layer 23 and a base substrate 10 are arranged in sequence outside the first groove 41.

Compared with a thickness difference of a film formed by the signal lines located in different layers and close to each other within the fan-out area, although a thickness difference of a film layer formed by the first organic insulating layer 40a, the second organic insulating layer 40b and the passivation layer 33 is also present inside and outside the first groove 41, its gradient changes gently so that it is not easily to cause damage or fracture of the first electrode layer 50, thereby reducing the risk of fracture or falling-off of the encapsulation layer 60, and further reducing the risk of GDS and improving the display effect and service life of the display device.

Referring to FIGS. 3A and 4B, the orthographic projection of the second power line 32 on the base substrate 10 at least partially overlaps with the fan-out area 12a in the third overlapping area. The groove includes a second groove 42, and the orthographic projection of the second groove 42 on the base substrate 10 partially overlaps with the third overlapping area. The third overlapping area is located between the orthographic projection of the second groove 42 on the base substrate 10 and the display area 11.

For the position B2 marked by the dotted line in FIG. 3A, FIG. 4B provides a schematic view of the hierarchical structure of the position B2. In FIG. 4B, the signal line layer 20 includes a first signal line layer 21 and a second signal line layer 22. The first signal line layer 21 includes a plurality of first signal lines 21a, 21b among the plurality of signal lines, and the second signal line layer 22 includes a plurality of second signal lines 22a, 22b among the plurality of signal lines. At least part of the plurality of second signal lines 22a, 22b extend in a direction parallel to and are arranged alternately at least part of the plurality of first signal lines 21a, 21b.

The first signal line and the second signal line are respectively located in different signal line layers which may be spaced apart by an insulating layer. For example, in FIG. 4B, the base substrate 10 is covered with a buffer layer 23, and the first signal lines 21a and 21b are formed on a surface of the buffer layer 23. The signal line layer 20 also includes a first insulating layer 24 and a second insulating layer 25. The first insulating layer 24 covers the surfaces of the first signal lines 21a, 21b and the buffer layer 23. The second signal lines 22a and 22b are formed on a surface of the first insulating layer 24. The second insulating layer 25 covers the surfaces of the second signal lines 22a, 22b and the first insulating layer 24.

The first metal layer 30 is spaced apart from the second metal layer 34 by a passivation layer 33. For example, the passivation layer 33 is located between the second power line 32 and the second metal layer 34. The second power line 32 is formed on the second insulating layer 25. At the position corresponding to the second groove 42, the passivation layer 33 has a second via hole corresponding to the second groove 42 so that the second metal layer 34 is electrically connected to the second power line 32 through the second via hole.

At the position corresponding to the second groove 42, the orthogonal projection of the spaced area between the first signal line 21a and the second signal line 22a on the base substrate at least partially overlaps with the edge of the orthographic projection of the second groove 42 on the base substrate 10. Although there is a thickness difference of a film above the first signal line 21a and the second signal line 22a, since the first electrode layer 50 does not cover inside or outside the second groove 42, the circumstance of damage and facture of the first electrode layer 50 at the edge of the second groove 42 is avoided.

Referring to FIGS. 3A and 4C, an overlapping position of the first electrode layer 50, the second power line 32 and the fan-out area 12a from the perspective of a top view of the display substrate, for example the position B3, is randomly selected, and there is no groove located in the organic insulating layer at the position. Referring to FIG. 4C, the second power line 32 is spaced apart from the second metal layer 34 by the passivation layer 33. Although there are distinct thickness differences of a film above the first signal lines 21a, 21b and the second signal lines 22a, 22b that are adjacent and located in different layers, the first organic insulating layer 40a located between the first electrode layer 50 and the second metal layer 34 and the second organic insulating layer 40b between the second metal layer 34 and the passivation layer 33 respectively serve as planarization layers, so that it is possible to improve the planarization above the first signal line and the second signal line, and reduce or avoid the risk of the first electrode layer 50, thereby reducing the risk of fracture or falling-off the encapsulation layer 60, and further reducing the risk of GDS, and improving the display effect and service life of the display device.

Referring to FIGS. 2B and 3A-4C, the display substrate includes a first metal layer 30 and a second metal layer 34 located on one side of the first metal layer 30 away from the base substrate 10. In some embodiments, the display substrate further includes a connection electrode 75. The connection electrode 75 is located between the drain 74 of the thin film transistor of the display sub-pixel and the anode 51 of the display sub-pixel, and electrically connected to the drain 74 and the anode 51 respectively.

In some embodiments, the connection electrode 75 is a part of the second metal layer 34, which allows that a part of the second metal layer 34 located in the non-display area and the connection electrode 75 located in the display area may be formed by the same patterning process, thereby simplifying the machining process. The organic insulating layer 40 includes a first organic insulating layer 40a located between the first metal layer 30 and the second metal layer 34, and a second organic insulating layer 40b located between the second metal layer 34 and the first electrode layer 50.

Referring to FIG. 4D, the groove includes a first groove portion located within the first organic insulating layer 40a and a second groove portion located within the second organic insulating layer 40b. In FIG. 4D, the position between the two edges 43 of the first groove portion corresponds to a solid material of the first organic insulating layer 40a, and the upper and lower sides of the two edges 43 correspond to a hollowed-out portion of the first organic insulating layer 40a. The two edges 44 of the second groove portion are located between the two edges 43 of the first groove portion, and the edge 44 at the lower right corner is a rectangle with a slightly small size. The position between the two edges 44 and the rectangle in the lower right corner corresponds to the hollowed-out portion of the second organic insulating layer 40b, and the other positions correspond to a solid material of the second organic insulating layer 40b.

The signal line layer 20 is an isosceles trapezoid in a top view. The beveled boundary 27 of the signal line layer 20 intersects with the edge 44 of the second groove at the position C1, and intersects with the edge 43 of the first groove at the position C2. It has been explained above that, when the signal lines of different layers in the signal line layer 20 are adjacent to each other and intersect with an edge of the groove, it is easily to cause a larger thickness difference between the inside and the outside of the groove. Therefore, at the position C1, the second organic insulating layer 40b covers the edge 43 of the first groove portion so that it is more planar at this position.

At the position C2, the signal line layer 20 intersects with the edge 43 of the first groove portion, and the second organic insulating layer 40b covers the edge 43 of the first groove portion so that it is more planar at this position. Correspondingly, the first electrode layer 50 is also allowed to cover this position, so as to avoid the problem that the first electrode portion covered thereon is easily fractured due to the uneven edge 43 of the first groove portion.

In the lower right position of FIG. 4D, the hollowed-out portion of the first groove portion overlaps with the hollowed-out portion of the second groove portion, for example, at the position C3 in FIG. 4D. Since neither the first groove portion nor the second groove portion at this position overlaps with the signal line layer 20, the first electrode layer 50 is allowed to cover this position (referring to FIG. 4A), thereby avoiding the problem that the first electrode portion covering this position is easily fractured.

In the above-described embodiments, the second metal layer 34 may be electrically connected to the first power line 31 through the first groove portion and electrically connected to the first electrode portion through the second groove portion.

The embodiments of the display substrate of the present disclosure described above may be applied to various display devices. Therefore, the present disclosure further provides a display device, which includes the display substrate as described previously. The display device may be any product or member having a display function, such as a mobile phone, a tablet computer, a television, a display, a notebook computer, a digital photo frame, a navigator, and the like.

Hereto, various embodiments of the present disclosure have been described in detail. Some details well known in the art are not described to avoid obscuring the concept of the present disclosure. According to the above-described description, those skilled in the art would fully know how to implement the technical solutions disclosed herein.

Although some specific embodiments of the present disclosure have been described in detail by way of examples, those skilled in the art should understand that the above-described examples are only for the purpose of illustration and are not intended to limit the scope of the present disclosure. It should be understood by those skilled in the art that modifications to the above-described embodiments and equivalently substitution of part of the technical features may be made without departing from the scope and spirit of the present disclosure. The scope of the present disclosure is defined by the appended claims.

What is claimed is:

1. A display substrate comprising:
a base substrate comprising a display area and a non-display area located at a periphery of the display area, wherein the non-display area comprises a fan-out area;
a signal line layer arranged on the base substrate and comprising a plurality of signal lines located in the fan-out area;
a first metal layer arranged on one side of the signal line layer away from the base substrate and comprising a first power line located in the non-display area;
a first electrode layer located on one side of the first metal layer away from the base substrate and comprising a first electrode portion, wherein an orthographic projection of the first electrode portion on the base substrate at least partially overlaps with an orthographic projection of the first power line on the base substrate, and the first electrode portion is electrically connected to the first power line; and
an organic insulating layer located between the first metal layer and the first electrode layer and having at least one groove located in the non-display area, wherein an orthographic projection of the organic insulating layer at an edge of the at least one groove on the base substrate at least partially overlaps, in a first area, with an orthographic projection of the fan-out area on the base substrate, and at least part of the first area does not overlap with the orthographic projection of the first electrode portion on the base substrate.

2. The display substrate according to claim 1, wherein the organic insulating layer is in direct contact with the first electrode layer.

3. The display substrate according to claim 1, further comprising a second metal layer located on one side of the first metal layer away from the base substrate, wherein the organic insulating layer comprises:
a first organic insulating layer located between the first metal layer and the second metal layer; and
a second organic insulating layer located between the second metal layer and the first electrode layer, wherein the at least one groove comprises a second groove portion located within the second organic insulating layer.

4. The display substrate according to claim 3, wherein the at least one groove comprises multiple grooves, the second metal layer comprises a metal portion electrically connected to the first power line and the first electrode portion through at least part of the multiple grooves.

5. The display substrate according to claim 1, further comprising:
a second metal layer located on one side of the first metal layer away from the base substrate,
wherein the organic insulating layer comprises:
a first organic insulating layer located between the first metal layer and the second metal layer; and
a second organic insulating layer located between the second metal layer and the first electrode layer,
wherein the at least one groove comprises a first groove portion located within the first organic insulating layer and a second groove portion located within the second organic insulating layer.

6. The display substrate according to claim 1, further comprising:
a second metal layer located on one side of the first metal layer away from the base substrate,
wherein the organic insulating layer comprises:
a first organic insulating layer located between the first metal layer and the second metal layer; and
a second organic insulating layer located between the second metal layer and the first electrode layer,
wherein the at least one groove comprises a first groove portion located within the first organic insulating layer, and the second organic insulating layer covers an upper side of the first groove portion.

7. The display substrate according to claim 1, wherein the first electrode portion is located in the non-display area and at least partially surrounds the display area.

8. The display substrate according to claim 1, wherein the display area comprises: a first boundary, a second boundary, a third boundary, and a fourth boundary, the first boundary and the third boundary are arranged opposite to each other, and the second boundary and the fourth boundary are arranged opposite to each other; and the non-display area comprises a first peripheral area located outside the first boundary, a second peripheral area located outside the second boundary, a third peripheral area located outside the third boundary and a fourth peripheral area located outside the fourth boundary, the fan-out area is located within the fourth peripheral area,
wherein the first electrode portion comprises:
a first portion continuously arranged in the first peripheral area, the second peripheral area, and the third peripheral area;
two second portions located in the fourth peripheral area, respectively connected to the first portion located in the first peripheral area and the third peripheral area, and extending in a direction parallel to the fourth boundary;
two third portions located in the fourth peripheral area, wherein orthographic projections of the two third portions on the base substrate overlap with the fan-out area;
two fourth portions located in the fourth peripheral area, wherein both ends of each of the two fourth portions are respectively connected to one of the two third portions and one of the two second portions; and
a fifth portion located in the fourth peripheral area, connected between the two third portions, and at least partially overlapping with the first power line.

9. The display substrate according to claim 8, wherein a width of each second portion in a direction perpendicular to the fourth boundary, a width of the fifth portion in a direction perpendicular to the fourth boundary, and a width of each fourth portion perpendicular to an extension direction of the fourth portion are all smaller than a width of each first portion perpendicular to an extension direction of the first portion, and are all larger than a width of each third portion in a direction perpendicular to the fourth boundary.

10. The display substrate according to claim 8, wherein an included angle between an extending direction of each fourth portion and the fourth boundary is 35 to 55 degrees.

11. The display substrate according to claim 8, wherein the fan-out area comprises two fan-out sub-areas symmetrical to each other relative to a symmetry axis perpendicular to the fourth boundary, the first electrode portions are symmetrical to each other relative to the symmetry axis, and the fifth portion is located between the two fan-out sub-areas.

12. The display substrate according to claim 8, wherein the first power line comprises:
a sixth portion continuously arranged in the first peripheral area, the second peripheral area and the third peripheral area;

two seventh portions located in the fourth peripheral area, respectively connected to the sixth portion located in the first peripheral area and the third peripheral area, and extending in a direction parallel to the fourth boundary; and an eighth portion located in the fourth peripheral area and between the two seventh portions, wherein an orthographic projection of the sixth portion on the base substrate partially overlaps with an orthographic projection of the first portion on the base substrate and is electrically connected to the first portion, orthographic projections of the two seventh portions on the base substrate partially overlap with orthographic projections of the two second portions on the base substrate and are electrically connected to the two second portions respectively, and an orthographic projection of the eighth portion on the base substrate partially overlaps with the fifth portion and the fan-out area and the eighth portion is electrically connected to the fifth portion.

13. The display substrate according to claim 12, wherein the sixth portion and the two seventh portions are both symmetrical to each other relative to a symmetry axis perpendicular to the fourth boundary, and the eighth portions are symmetrical to each other relative to the symmetry axis and are T-shaped.

14. The display substrate according to claim 12, wherein the first metal layer further comprises a second power line located in the fourth peripheral area, and an orthographic projection of the second power line on the base substrate partially overlaps with the fan-out area and does not overlap with the orthographic projection of the first power line on the base substrate.

15. The display substrate according to claim 1, wherein the signal line layer comprises:
   a first signal line layer arranged on the base substrate and comprising a plurality of first signal lines among the plurality of signal lines; and
   a second signal line layer arranged on one side of the first signal line layer away from the base substrate and comprising a plurality of second signal lines among the plurality of signal lines, wherein at least part of the plurality of second signal lines extend in parallel to and arranged alternately with at least part of the plurality of first signal lines, wherein in a direction parallel to the base substrate and perpendicular to an extending direction of the plurality of first signal lines or an extending direction of the plurality of second signal lines, an area between adjacent first signal line and second signal line among the plurality of first signal lines and the plurality of second signal lines is a second area, and an edge of an orthographic projection of the at least one groove on the base substrate at least partially overlaps with an orthographic projection of the second area on the base substrate.

16. The display substrate according to claim 15, further comprising:
   a display sub-pixel having a thin film transistor, a capacitor and an anode, wherein the thin film transistor comprises a gate, a source and a drain, and the capacitor comprises a first polar plate and a second polar plate,
   wherein the gate and the first polar plate are in the same layer and have the same material as the plurality of first signal lines, and the second polar plate is in the same layer and has the same material as the plurality of second signal lines;
   the source and the drain are a part of the first metal layer; _or
   the anode is a part of the first electrode layer.

17. The display substrate according to claim 16, further comprising:
   a second metal layer located on one side of the first metal layer away from the base substrate; and
   a connection electrode located between the drain and the anode, and electrically connected to the drain and the anode respectively,
   wherein the connection electrode is a part of the second metal layer.

18. The display substrate according to claim 1, further comprising:
   an encapsulation layer located on one side of the first electrode layer away from the base substrate, and covering the display area and part of the non-display area.

19. A display device comprising the display substrate according to claim 1.

* * * * *